United States Patent
Kim et al.

(10) Patent No.: US 12,190,824 B2
(45) Date of Patent: Jan. 7, 2025

(54) TRANSMISSION GATE CIRCUIT, INVERTER CIRCUIT AND GATE DRIVING CIRCUIT INCLUDING THE SAME

(71) Applicants: Samsung Display Co., Ltd., Yongin-Si (KR); Konkuk University Industrial Cooperation Corp, Seoul (KR)

(72) Inventors: Kyungho Kim, Yongin-si (KR); Keechan Park, Seoul (KR); Yikyoung You, Seoul (KR); Sangyong No, Yongin-si (KR); Gichang Lee, Yongin-si (KR); Nokyung Park, Yongin-si (KR); Sunkwun Son, Yongin-si (KR); Donghee Shin, Yongin-si (KR)

(73) Assignees: Samsung Display Co., Ltd., Yongin-Si (KR); Konkuk University Industrial Cooperation Corp, Seoul (KR)

( * ) Notice: Subject to any disclaimer, the term of this patent is extended or adjusted under 35 U.S.C. 154(b) by 0 days.

(21) Appl. No.: 18/205,901

(22) Filed: Jun. 5, 2023

(65) Prior Publication Data
US 2024/0054959 A1    Feb. 15, 2024

(30) Foreign Application Priority Data

Aug. 12, 2022   (KR) .................. 10-2022-0101585

(51) Int. Cl.
    *G09G 3/3266*   (2016.01)
(52) U.S. Cl.
    CPC .............. *G09G 3/3266* (2013.01); *G09G 2300/0842* (2013.01); *G09G 2310/0286* (2013.01)

(58) Field of Classification Search
CPC ......... G09G 3/3266; G09G 2300/0842; G09G 2310/0286; G09G 2300/0408; G09G 2300/0417; G09G 3/3233; G09G 2310/0289; G09G 2230/00; G09G 2310/08; G11C 19/28; H03K 19/094
See application file for complete search history.

(56) References Cited

U.S. PATENT DOCUMENTS

| | | | |
|---|---|---|---|
| 9,343,031 B2 | 5/2016 | Yu et al. | |
| 9,548,026 B2 | 1/2017 | Jang | |
| 10,573,223 B2 | 2/2020 | Kong et al. | |
| 10,672,357 B2 | 6/2020 | Lee et al. | |
| 11,443,674 B2 | 9/2022 | Hong et al. | |

(Continued)

FOREIGN PATENT DOCUMENTS

| | | |
|---|---|---|
| KR | 10-2017-0087079 A | 7/2017 |
| KR | 10-2018-0049479 A | 5/2018 |

(Continued)

OTHER PUBLICATIONS

Kyoung-Seok Son, Ji-Sim Jung, Kwang-Hee Lee, Tae-Sang Kim, Joon-Seok Park, Yun-Hyuk Choi, Keechan Park, Jang-Yeon Kwon, Bonwon Koo, and Sang-Yoon Lee, "Characteristics of Double-Gate Ga—In—Zn—O Thin-Film Transistor", IEEE Electron Device Letters, vol. 31, No. 3, pp. 219-221, Mar. 2010, United States.

*Primary Examiner* — Mihir K Rayan
(74) *Attorney, Agent, or Firm* — Innovation Counsel LLP

(57) ABSTRACT

A gate driving circuit includes a capacitor connected between a first gate of a pull-down transistor and a control node, and a control transistor connected between the control node and a ground terminal and having a gate connected to the ground terminal.

25 Claims, 15 Drawing Sheets

(56) References Cited

U.S. PATENT DOCUMENTS

| | | | | |
|---|---|---|---|---|
| 2010/0164943 A1* | 7/2010 | Liu | ............... | G09G 3/3677 |
| | | | | 345/87 |
| 2018/0012550 A1* | 1/2018 | Lim | ............... | G09G 3/3225 |
| 2021/0012708 A1* | 1/2021 | Yang | ............... | G09G 3/3225 |

FOREIGN PATENT DOCUMENTS

| KR | 10-1975581 B1 | 9/2019 |
|---|---|---|
| KR | 10-2022-0037660 A | 3/2022 |

\* cited by examiner

TRANSMISSION GATE CIRCUIT, INVERTER CIRCUIT AND GATE DRIVING CIRCUIT INCLUDING THE SAME

CROSS-REFERENCE TO RELATED APPLICATION

This application is based on and claims priority under 35 U.S.C. § 119 to Korean Patent Application No. 10-2022-0101585, filed on Aug. 12, 2022, in the Korean Intellectual Property Office, the disclosure of which is incorporated by reference herein in its entirety.

BACKGROUND

1. Field

One or more embodiments relate to a transmission gate circuit, an inverter circuit, and a gate driving circuit for a display device including the same.

2. Description of the Related Art

In general, a display device includes a pixel portion including a plurality of pixels, a gate driving circuit, a data driving circuit, and a controller. The gate driving circuit includes stages connected to gate lines, and the stages supply gate signals to the gate lines connected thereto, in response to signals from the controller.

SUMMARY

One or more embodiments include a gate driving circuit configured to stably output a gate signal. The technical problems to be achieved by one or more embodiments are not limited to the technical problems described above, and other technical problems not described herein will be clearly understood from the present description by those of ordinary skill in the art.

Additional aspects will be set forth in part in the description which follows and, in part, will be apparent from the description, or may be learned by practice of the presented embodiments of the disclosure.

According to one or more embodiments, a gate driving circuit includes a plurality of stages. Each of the plurality of stages includes a signal transmission unit, a first inverter, and a second inverter. The signal transmission unit is connected between an input terminal to which a start signal is configured to be applied and a first node, and is configured to transmit, to the first node, the start signal according to a clock signal. The first inverter is configured to control a voltage level of a second node according to a voltage level of the first node. The second inverter is configured to output an output signal of a first voltage of a first voltage level or a second voltage of a second voltage level according to the voltage level of the second node. The second inverter includes a first pull-up transistor, a first pull-down transistor, a first capacitor, and a first control transistor. The first pull-up transistor is connected between a first voltage input terminal configured to supply the first voltage and an output terminal, and includes a gate connected to the second node. The first pull-down transistor is connected between a second voltage input terminal configured to supply the second voltage and the output terminal, and includes a first gate connected to the second node and a second gate connected to a first control node. The first capacitor is connected between the first gate of the first pull-down transistor and the first control node. The first control transistor is connected between the first control node and a ground terminal and includes a gate connected to the ground terminal.

In an embodiment, the first pull-down transistor may be an N-channel oxide transistor.

In an embodiment, the first gate of the first pull-down transistor may be a top gate above a semiconductor layer, and the second gate of the first pull-down transistor may be a bottom gate under the semiconductor layer.

In an embodiment, the first inverter may include a second pull-up transistor, a second pull-down transistor, a second capacitor, and a second control transistor. The second pull-up transistor is connected between the first voltage input terminal and the second node and includes a gate connected to the first node. The second pull-down transistor is connected between the second voltage input terminal and the second node and includes a first gate connected to the first node and a second gate connected to a second control node. The second capacitor is connected between the first gate of the second pull-down transistor and the second control node. The second control transistor is connected between the second control node and the ground terminal and includes a gate connected to the ground terminal.

In an embodiment, the second pull-down transistor may be an N-channel oxide transistor.

In an embodiment, the first gate of the second pull-down transistor may be a top gate above a semiconductor layer, and the second gate of the second pull-down transistor may be a bottom gate under the semiconductor layer.

In an embodiment, the signal transmission unit may include a first transistor, a second transistor, a third capacitor, and a third control transistor. The first transistor is connected between the input terminal and the first node and includes a gate connected to a second clock terminal. The second transistor is connected between the input terminal and the first node and includes a first gate connected to a first clock terminal and a second gate connected to a third control node. The third capacitor is connected between the first gate of the second transistor and the third control node. The third control transistor is connected between the third control node and the ground terminal and includes a gate connected to the ground terminal.

In an embodiment, a second clock signal configured to be applied to the second clock terminal may be an inverted signal of a first clock signal configured to be applied to the first clock terminal.

In an embodiment, the second transistor may be an N-channel oxide transistor.

In an embodiment, the first gate of the second transistor may be a top gate above a semiconductor layer, and the second gate of the second transistor may be a bottom gate under the semiconductor layer.

In an embodiment, the gate driving circuit may further include a fourth capacitor connected between the first node and a third voltage supply terminal.

In an embodiment, the third voltage supply terminal may be the ground terminal.

In an embodiment, the third voltage supply terminal may be configured to receive the first voltage or the second voltage.

In an embodiment, the first pull-up transistor may include a plurality of sub-transistors connected in parallel between the first voltage input terminal and the output terminal.

In an embodiment, the start signal may be an output signal configured to be output from a previous stage.

According to one or more embodiments, a transmission gate circuit includes a first transistor, a second transistor, a capacitor, and a third transistor. The first transistor is connected between an input terminal and an output terminal and includes a gate connected to a second clock terminal. The second transistor is connected between the input terminal and the output terminal and includes a first gate connected to a first clock terminal and a second gate connected to a control node. The capacitor is connected between the first gate of the second transistor and the control node. The third transistor is connected between the control node and a ground terminal and includes a gate connected to the ground terminal.

In an embodiment, a second clock signal configured to be applied to the second clock terminal may be an inverted signal of a first clock signal configured to be applied to the first clock terminal.

In an embodiment, the second transistor may be an N-channel oxide transistor.

According to one or more embodiments, an inverter circuit includes a first transistor, a second transistor, a capacitor, and a third transistor. The first transistor is connected between a first voltage input terminal to which a first voltage of a first voltage level is configured to be applied and an output terminal, and includes a gate connected to an input terminal. The second transistor is connected between a second voltage input terminal to which a second voltage of a second voltage level is configured to be applied and the output terminal, and includes a first gate connected to the input terminal and a second gate connected to a control node. The capacitor is connected between the first gate of the second transistor and the control node. The third transistor is connected between the control node and a ground terminal and includes a gate connected to the ground terminal.

In an embodiment, the second transistor may be an N-channel oxide transistor.

According to one or more embodiments, a gate driving circuit includes a transmission circuit, and an inverter circuit. The transmission circuit is configured to receive a clock signal and an inverted clock signal and transmit an input signal to a first node. The inverter circuit is configured to receive a first reference voltage and a second reference voltage and invert and output a voltage level of a voltage of the first node. Each of the transmission circuit and the inverter circuit includes a P-channel transistor and an N-channel transistor.

In an embodiment, the transmission circuit may include a first transistor, a second transistor, a first capacitor, and a first control transistor. The first transistor is connected between an input terminal and the first node, and includes a gate connected to a second clock terminal to which the inverted clock signal is configured to be supplied. The second transistor is connected between the input terminal and the first node, and includes a first gate connected to a first clock terminal to which the clock signal is configured to be supplied and a second gate connected to a first control node. The first capacitor is connected between the first gate of the second transistor and the first control node. The first control transistor is connected between the first control node and a ground terminal and includes a gate connected to the ground terminal. The second transistor may be an N-channel transistor.

In an embodiment, the inverter circuit may include a first inverter, and a second inverter. The first inverter is configured to invert a voltage level of a voltage of the first node and output a voltage of the inverted voltage level to a second node. The second inverter is configured to invert a voltage level of a voltage of the second node and output a voltage of the inverted voltage level to an output terminal.

In an embodiment, the first inverter may include a fourth transistor, a fifth transistor, a second capacitor, and a sixth transistor. The fourth transistor is connected between a first voltage input terminal configured to supply the first reference voltage and the second node, and includes a gate connected to the first node. The fifth transistor is connected between a second voltage input terminal configured to supply the second reference voltage and the second node, and includes a first gate connected to the first node and a second gate connected to a second control node. The second capacitor is connected between the first gate of the fifth transistor and the second control node. The sixth transistor is connected between the second control node and a ground terminal and including a gate connected to the ground terminal. The fifth transistor may be an N-channel transistor.

In an embodiment, the second inverter may include a seventh transistor, an eighth transistor, a third capacitor, and a ninth transistor. The seventh transistor is connected between a first voltage input terminal configured to supply the first reference voltage and the output terminal, and includes a gate connected to the second node. The eighth transistor is connected between a second voltage input terminal configured to supply the second reference voltage and the output terminal, and includes a first gate connected to the second node and a second gate connected to a third control node. The third capacitor is connected between the first gate of the eighth transistor and the third control node. The ninth transistor is connected between the third control node and a ground terminal and including a gate connected to the ground terminal. The eighth transistor may be an N-channel transistor.

In an embodiment, the gate driving circuit may further include a fourth capacitor connected between the first node and a third voltage supply terminal.

BRIEF DESCRIPTION OF THE DRAWINGS

The above and other aspects, features, and advantages of certain embodiments of the disclosure will be more apparent from the following description taken in conjunction with the accompanying drawings.

DETAILED DESCRIPTION

Figure 1:
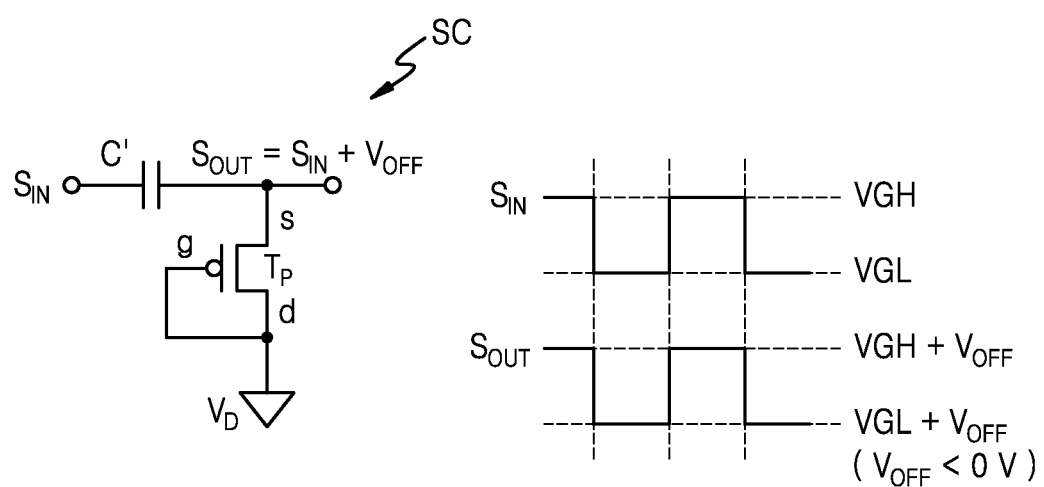
FIG. 1 is a signal generation circuit according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, the present embodiments may have different forms and should not be construed as being limited to the descriptions set forth herein.

While such terms as "first" and "second" may be used to describe various elements, such elements must not be limited to the above terms. The above terms are used only to distinguish one element from another.

The singular forms "a," "an," and "the" as used herein are intended to include the plural forms as well unless the context clearly indicates otherwise.

It will be understood that the terms "include," "comprise," and "have" as used herein specify the presence of stated features or elements but do not preclude the addition of one or more other features or elements.

It will be further understood that, when a layer, region, or element is referred to as being on another layer, region, or element, it may be directly or indirectly on the other layer, region, or element. That is, for example, intervening layers, regions, or elements may be present.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

As used herein, the expression "A and/or B" refers to A, B, or A and B. In addition, the expression "at least one of A and B" refers to A, B, or A and B.

As used herein, when it is referred that X and Y are connected, it may include the case where X and Y are electrically connected, the case where X and Y are functionally connected, and the case where X and Y are directly connected. In this regard, X and Y may include objects, e.g., apparatuses, devices, circuits, wirings, electrodes, terminals, conductive layers, layers, and other objects. Therefore, a connection is not limited to a preset connection relationship, for example, not limited to a connection relationship illustrated in the drawings or detailed descriptions, and may include other connection relationships not illustrated in the drawings or detailed descriptions.

The case where X and Y are electrically connected may include, for example, the case where at least one device, e.g., a switch, a transistor, a capacitance element, an inductor, a resistance element, a diode, and other devices, that enables electrical connection of X and Y is connected between X and Y.

As used herein, "ON" used in association with an element state may denote an activated state of an element, and "OFF" may denote an inactivated state of an element. "ON" used in association with a signal received by an element may denote a signal activating the element, and "OFF" may denote a signal inactivating the element. An element may be activated by a high-level voltage or a low-level voltage. For example, a P-type transistor (P-channel transistor) is activated by a low-level voltage, and an N-type transistor (N-channel transistor) is activated by a high-level voltage. Therefore, it should be understood that "ON" voltages for a P-channel transistor and an N-channel transistor are opposite, e.g., low versus high, voltage levels. Hereinafter, a voltage and a voltage level for activating, e.g., turning on, a transistor are referred to as an on voltage and an on voltage level, respectively, and a voltage and a voltage level for inactivating, e.g., turning off, a transistor are referred to as an off voltage and an off voltage level, respectively.

In the following embodiments, depending on the type, e.g., P-channel or N-channel and/or operation conditions of a transistor, a first terminal of the transistor may be a source terminal or a drain terminal, and a second terminal may be a terminal different from the first terminal. For example, when the first terminal is a source terminal, the second terminal may be a drain terminal. In an embodiment, the source terminal and the drain terminal may be interchangeably referred to as a source electrode and a drain electrode, respectively.

FIG. 1 is a signal generation circuit SC according to an embodiment.

Referring to FIG. 1, the signal generation circuit SC according to an embodiment may include a P-channel transistor $T_P$ in which a gate g and a drain d are diode-connected and a capacitor C'. The signal generation circuit SC may be configured to generate an output signal $S_{OUT}$, based on an input signal $S_{IN}$ applied to one end of the capacitor C', and output the output signal $S_{OUT}$ at a node where the other end of the capacitor C' and a source s of the P-channel transistor $T_P$ are connected.

The input signal $S_{IN}$ may be a square wave signal in which a first voltage VGH of a first voltage level and a second voltage VGL of a second voltage level are repeated. The output signal $S_{OUT}$ may have a constant negative offset voltage $V_{OFF}$ compared to the input signal $S_{IN}$ and may have the same waveform as the input signal $S_{IN}$. When the input signal $S_{IN}$ is applied, due to voltage coupling by the capacitor C', a maximum value of the output signal $S_{OUT}$ at the node may be a difference $(V_D-V_{TP})$ between a voltage $V_D$ applied to the drain d of the P-channel transistor $T_P$ and a threshold voltage $(V_{TP})$ of the P-channel transistor $T_P$.

Figure 2:
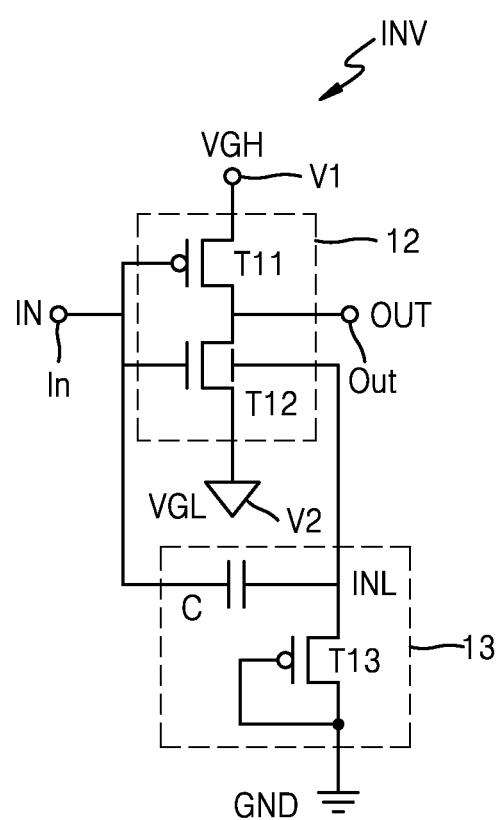
FIG. 2 is a diagram showing an inverter circuit according to an embodiment.
Figure 3:
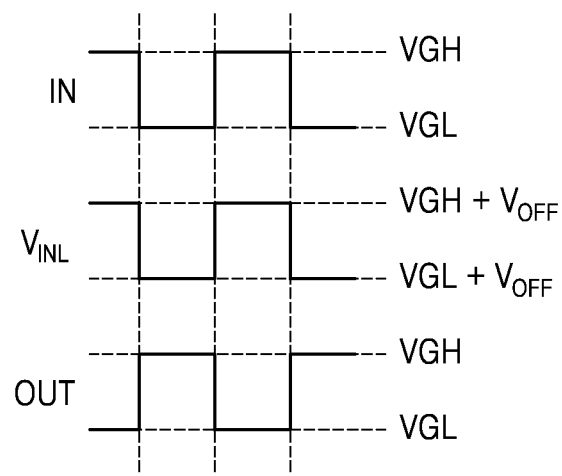
FIG. 3 is a timing diagram showing operations of the inverter circuit of FIG. 2.

FIG. 2 is a diagram showing an inverter circuit INV according to an embodiment. FIG. 3 is a timing diagram showing operations of the inverter circuit INV of FIG. 2.

Referring to FIG. 2, the inverter circuit INV according to an embodiment may include an output unit 12 and a node controller 13. The inverter circuit INV may include the node controller 13 to which the signal generation circuit SC of FIG. 1 has been applied, and the node controller 13 may receive a ground voltage, which is an example of the voltage $V_D$ of FIG. 1.

The inverter circuit INV may include at least one transistor. The at least one transistor may include an N-channel transistor and/or a P-channel transistor. For example, as shown in FIG. 2, a first transistor T11 and a third transistor T13 of the inverter circuit INV may each be a P-channel transistor, and a second transistor T12 of the inverter circuit INV may be an N-channel transistor. The P-channel transistor may be a P-channel silicon semiconductor transistor. The N-channel transistor may be a N-channel oxide semiconductor transistor. The N-channel oxide semiconductor transistor may be a dual gate transistor including a first gate, which is a top gate disposed above a semiconductor, and a second gate, which is a bottom gate disposed under the semiconductor.

The output unit 12 may include the first transistor T11 and the second transistor T12.

The first transistor T11 may include a gate connected to an input terminal In to which an input signal IN is applied, a first terminal connected to a first voltage input terminal V1 to which the first voltage VGH is applied, and a second terminal connected to an output terminal Out for outputting an output signal OUT. The first transistor T11 may be a pull-up transistor configured to transfer the first voltage VGH of a high level to the output terminal Out when turned on.

The second transistor T12 may include a first gate connected to the input terminal In and a second gate connected to a control node INL. The second transistor T12 may include a first terminal connected to the output terminal Out and a second terminal connected to a second voltage input terminal V2 to which the second voltage VGL is applied. The second transistor T12 may be a pull-down transistor configured to transfer the second voltage VGL of a low level to the output terminal Out when turned on.

The node controller 13 may include a capacitor C and the third transistor T13. The node controller 13 may control a voltage of the control node INL, based on the input signal IN. A voltage applied to the second gate of the second transistor T12 may be controlled according to the voltage of the control node INL to control a threshold voltage of the second transistor T12.

The capacitor C may include a first electrode connected to the input terminal In and a second electrode connected to the control node INL.

The third transistor T13 may include a gate connected to a ground terminal GND, a first terminal connected to the control node INL, and a second terminal connected to the ground terminal GND. The third transistor T13 may be connected to the control node INL in a diode connection manner in which the gate and the second terminal are connected to the ground terminal GND.

Referring to FIG. 3, the input signal IN may be a square wave signal in which the first voltage VGH of a first voltage level and the second voltage VGL of a second voltage level are repeated. The first voltage level may be higher than the second voltage level. For example, the first voltage VGH may have a positive value, and the second voltage VGL may have a negative value. In an embodiment, the first voltage VGH may be a high-level on voltage at which the N-channel transistor may be turned on, and the second voltage VGL may be a low-level on voltage at which the P-channel transistor may be turned on.

The control node INL may have a node voltage $V_{INL}$ with the negative offset voltage $V_{OFF}$ added to the input signal IN by the capacitor C and the third transistor T13. The node voltage $V_{INL}$ may have the same waveform as the input signal IN and may have a value of a voltage level lower than that of the input signal IN. A maximum value of the node voltage $V_{INL}$ may be a negative value (−Vth) of a threshold voltage (Vth) of the third transistor T13.

When the input signal IN is at the second voltage level, the second voltage VGL may be applied to the gate of the first transistor T11 and the first gate of the second transistor T12 to turn on the first transistor T11 and turn off the second transistor T12. In this regard, the node voltage $V_{INL}$ applied to the second gate of the second transistor T12 connected to the control node INL may be VGL+$V_{OFF}$, which may have a lower voltage level than the second voltage VGL. Accordingly, a threshold voltage of the second transistor T12 may increase, thereby stably turning off the second transistor T12. In addition, the first voltage VGH may be transferred to the output terminal Out by the turned-on first transistor T11, and thus, the output signal OUT of the first voltage VGH may be output from the output terminal Out.

When the input signal IN is at the first voltage level, the first voltage VGH may be applied to the gate of the first transistor T11 and the first gate of the second transistor T12 to turn off the first transistor T11 and turn on the second transistor T12. In this regard, the node voltage $V_{INL}$ applied to the second gate of the second transistor T12 connected to the control node INL may be VGH+$V_{OFF}$, which may have a lower voltage level than the first voltage VGH and may have a higher voltage level than the second voltage VGL. In an embodiment, when the input signal IN is at the first voltage level, the node voltage $V_{INL}$ may be a positive voltage having a lower voltage level than the first voltage VGH. Accordingly, a threshold voltage of the second transistor T12 may decrease, thereby stably turning on the second transistor T12. The second voltage VGL may be transferred to the output terminal Out by the turned-on second transistor T12, and thus, the output signal OUT of the second voltage VGL may be output from the output terminal Out.

Figure 4:
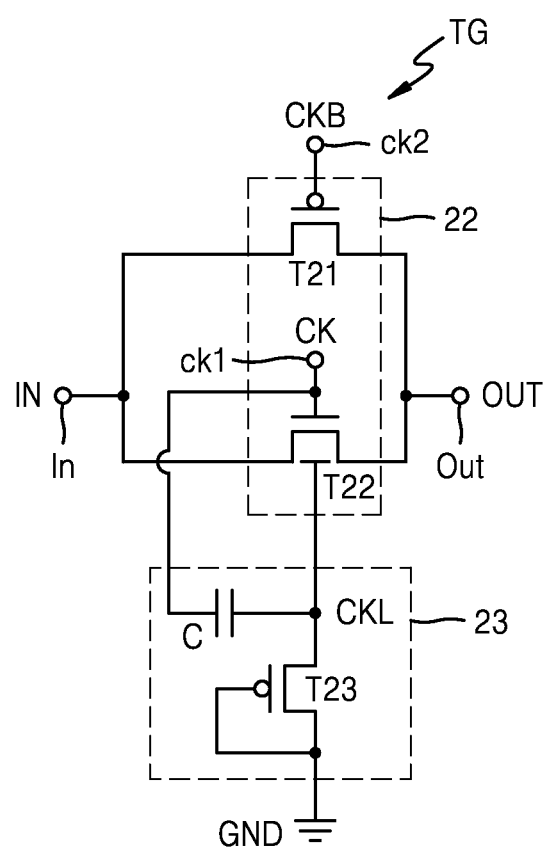
FIG. 4 is a diagram showing a transmission gate circuit according to an embodiment.
Figure 5:
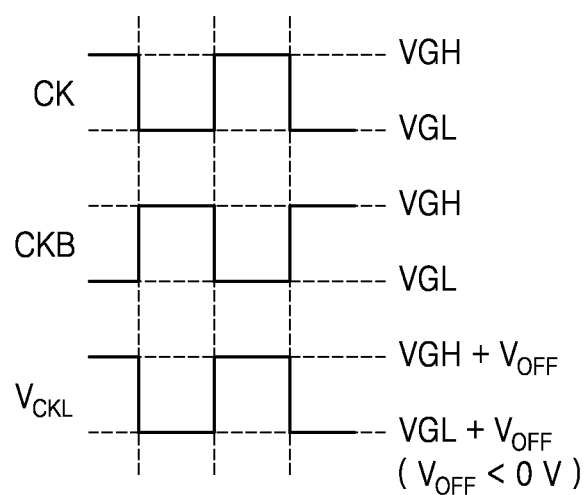
FIG. 5 is a timing diagram showing operations of the transmission gate circuit of FIG. 4.

FIG. 4 is a diagram showing a transmission gate circuit TG according to an embodiment. FIG. 5 is a timing diagram showing operations of the transmission gate circuit TG of FIG. 4.

Referring to FIG. 4, the transmission gate circuit TG according to an embodiment may include a switch unit 22 and a node controller 23. The transmission gate circuit TG may include the node controller 23 to which the signal generation circuit SC of FIG. 1 has been applied.

The transmission gate circuit TG may include at least one transistor. The at least one transistor may include an N-channel transistor and/or a P-channel transistor. For example, as shown in FIG. 4, a first transistor T21 and a third transistor T23 of the transmission gate circuit TG may each be a P-channel transistor. A second transistor T22 of the transmission gate circuit TG may be an N-channel transistor. The P-channel transistor may be a P-channel silicon semiconductor transistor. The N-channel transistor may be a N-channel oxide semiconductor transistor. The N-channel oxide semiconductor transistor may be a dual gate transistor including a first gate, which is a top gate disposed above a semiconductor, and a second gate, which is a bottom gate disposed under the semiconductor.

The switch unit 22 may include the first transistor T21 and the second transistor T22. The first transistor T21 and the second transistor T22 may be connected in parallel between the input terminal In and the output terminal Out. The switch unit 22 may transmit the input signal IN applied to the input terminal In to the output terminal Out due to a first clock signal CK and a second clock signal CKB or may block the transmission.

The first transistor T21 may include a gate connected to a second clock terminal ck2 to which the second clock signal CKB is applied, a first terminal connected to the input terminal In to which the input signal IN is applied, and a second terminal connected to the output terminal Out for outputting the output signal OUT.

The second transistor T22 may include a first gate connected to a first clock terminal ck1 to which the first clock signal CK is applied and a second gate connected to a control node CKL. The second transistor T22 may include a first terminal connected to the input terminal In and a second terminal connected to the output terminal Out.

The node controller 23 may include the capacitor C and the third transistor T23. The node controller 23 may control a voltage of the control node CKL, based on the first clock signal CK. A voltage applied to the second gate of the second transistor T22 may be controlled according to the voltage of the control node CKL to control a threshold voltage of the second transistor T22.

The capacitor C may include a first electrode connected to the first clock terminal ck1 and a second electrode connected to the control node CKL.

The third transistor T23 may include a gate connected to the ground terminal GND, a first terminal connected to the control node CKL, and a second terminal connected to the ground terminal GND. The third transistor T23 may be connected to the control node CKL in a diode connection manner in which the gate and the second terminal are connected to the ground terminal GND.

Referring to FIG. 5, the first clock signal CK and the second clock signal CKB may each be a square wave signal in which the first voltage VGH of a first voltage level and the second voltage VGL of a second voltage level are repeated. The first clock signal CK and the second clock signal CKB may be signals having the same waveform and shifted phases. For example, the second clock signal CKB may be an inverted signal having the same waveform as the first clock signal CK and having a phase difference of 180 degrees, e.g., a phase difference of ½ period, with respect to the first clock signal CK.

The control node CKL may have a node voltage $V_{CKL}$ with the negative offset voltage $V_{OFF}$ added to the first clock signal CK by the capacitor C and the third transistor T23. The node voltage $V_{CKL}$ may have the same waveform as the first clock signal CK and may have a lower voltage level than the first clock signal CK. A maximum value of the node voltage $V_{CKL}$ may be a negative value (−Vth) of a threshold voltage (Vth) of the third transistor T23.

When the first clock signal CK is at the first voltage level, and the second clock signal CKB is at the second voltage level, the second voltage VGL may be applied to the gate of the first transistor T21 to turn on the first transistor T21, and the first voltage VGH may be applied to the first gate of the second transistor T22 to turn on the second transistor T22. The node voltage $V_{CKL}$ may be VGH+$V_{OFF}$, which may be a positive voltage having a lower voltage level than the first voltage VGH. Accordingly, a threshold voltage of the second transistor T22 may decrease, thereby stably turning on the second transistor T22.

When the first clock signal CK is at the second voltage level, and the second clock signal CKB is at the first voltage level, the first voltage VGH may be applied to the gate of the first transistor T21 to turn off the first transistor T21, and the second voltage VGL may be applied to the first gate of the second transistor T22 to turn off the second transistor T22. The node voltage $V_{CKL}$ may be VGL+$V_{OFF}$, which may have a lower voltage level than the second voltage VGL. Accordingly, a threshold voltage of the second transistor T22 may increase, thereby stably turning off the second transistor T22.

Figure 6:
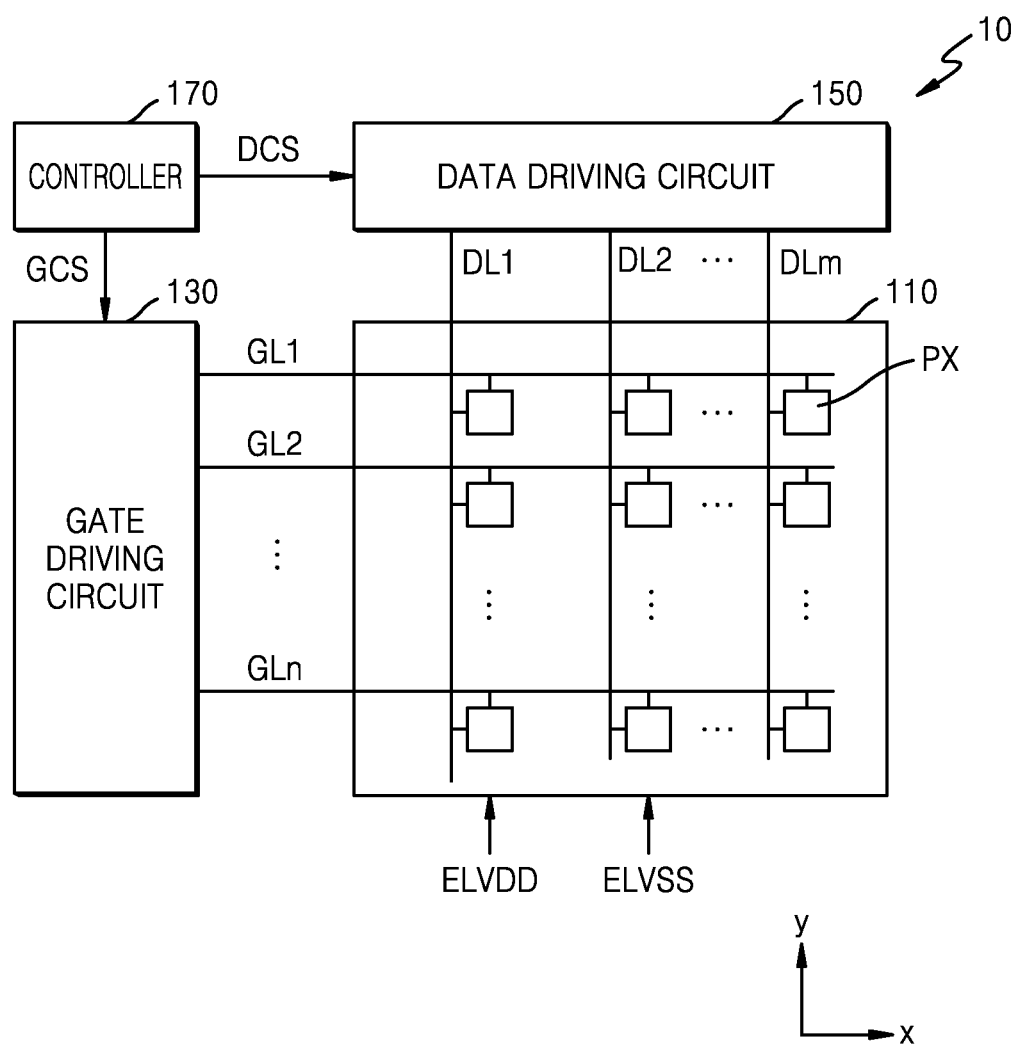
FIG. 6 is a schematic diagram of a display device according to an embodiment.

FIG. 6 is a schematic diagram of a display device 10 according to an embodiment.

The display device 10 according to one or more embodiments may be implemented as an electronic device, such as a smartphone, a mobile phone, a smartwatch, a navigation device, a game console, a television (TV), an automotive head unit, a notebook computer, a laptop computer, a tablet computer, a personal media player (PMP), a personal digital assistant (PDA), etc. In addition, the electronic device may be a flexible device.

Referring to FIG. 6, the display device 10 according to an embodiment may include a pixel portion 110, a gate driving circuit 130, a data driving circuit 150, and a controller 170.

A plurality of pixels PX and signal lines configured to apply an electrical signal to the plurality of pixels PX may be arranged in the pixel portion 110.

The plurality of pixels PX may be repeatedly arranged in a first direction, e.g., direction x, row direction, and a second direction, e.g., direction y, column direction. The plurality of pixels PX may be arranged in various forms, such as a stripe form, a PenTile form, and a mosaic form, to display an image. Each of the plurality of pixels PX may include an organic light-emitting diode as a display element, and the organic light-emitting diode may be connected to a pixel circuit. The pixel circuit may include a plurality of transistors and at least one capacitor.

In an embodiment, transistors of the pixel circuit may be N-channel transistors. In an embodiment, some from among transistors of the pixel circuit may be P-channel transistors, and others may be N-channel transistors.

In an embodiment, N-channel transistors included in the pixel portion 110 may be N-channel oxide thin-film transistors. For example, oxide thin-film transistors may be low-temperature polycrystalline oxide (LTPO) thin-film transistors. However, this is an example, and the N-channel transistors are not limited thereto. For example, an active pattern, e.g., a semiconductor layer, included in the transistors may include an inorganic semiconductor, e.g., amorphous silicon, polysilicon, or an organic semiconductor.

The signal lines configured to apply an electrical signal to the plurality of pixels PX may include a plurality of gate lines GL1 to GLn extending in the first direction X and a plurality of data lines DL1 to DLm extending in the second direction Y. The plurality of gate lines GL1 to GLn may be apart from each other in the second direction Y and may be configured to transmit a gate signal to the pixels PX. The plurality of data lines DL1 to DLm may be apart from each other in the first direction X and may be configured to transmit a data signal to the pixels PX. Each of the plurality of pixels PX may be connected to at least one corresponding gate line from among the plurality of gate lines GL1 to GLn and a corresponding data line from among the plurality of data lines DL1 to DLm.

The gate driving circuit 130 may be connected to the plurality of gate lines GL1 to GLn, and may generate a gate signal in response to a gate driving control signal GCS from the controller 170 and sequentially supply the gate signal to the gate lines GL1 to GLn. The gate lines GL1 to GLn may be connected to a gate electrode of a transistor included in the pixel PX, and the gate signal may control turn-on and turn-off of the transistor to which a gate line is connected. The gate signal may be a square wave signal in which an on voltage at which the transistor may be turned on and an off voltage at which the transistor may be turned off are repeated.

The data driving circuit 150 may be connected to the plurality of data lines DL1 to DLm, and may supply data signals to the data lines DL1 to DLm in response to a data driving control signal DCS from the controller 170. The data signals supplied to the data lines DL1 to DLm may be supplied to the pixels PX to which the gate signal is supplied.

When the display device 10 is an organic light-emitting diode display device, a first power voltage ELVDD and a second power voltage ELVSS may be supplied to the pixels PX of the pixel portion 110. The first power voltage ELVDD may be a high-level voltage provided for a first electrode, e.g., a pixel electrode or an anode, of an organic light-emitting diode included in each pixel PX. The second power voltage ELVSS may be a low-level voltage provided for a second electrode, e.g., an opposite electrode or a cathode, of the organic light-emitting diode. The first power voltage ELVDD and the second power voltage ELVSS are driving voltages that allow the plurality of pixels PX to emit light.

The controller 170 may generate the gate driving control signal GCS and the data driving control signal DCS, based on signals input from the outside. The controller 170 may supply the gate driving control signal GCS to the gate driving circuit 130 and may supply the data driving control signal DCS to the data driving circuit 150.

Although FIG. 6 shows the pixel PX connected to one gate line, this is an example, and the pixel PX may be connected to one or more gate lines. For example, the gate driving circuit 130 may be connected to a plurality of first gate lines and a plurality of second gate lines. In an embodiment, one gate driving circuit 130 may generate a first gate signal and a second gate signal at different timings. In an embodiment, a first gate driving circuit for generating a first gate signal and a second gate driving circuit for generating a second gate signal may be independently configured.

Figure 7A:
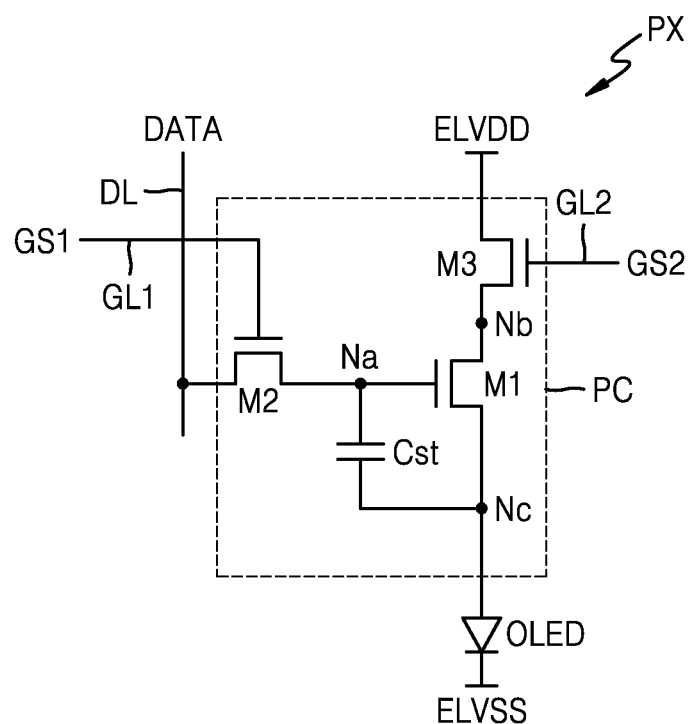
FIGS. 7A and 7B are equivalent circuit diagrams showing a pixel according to an embodiment.
Figure 7B:
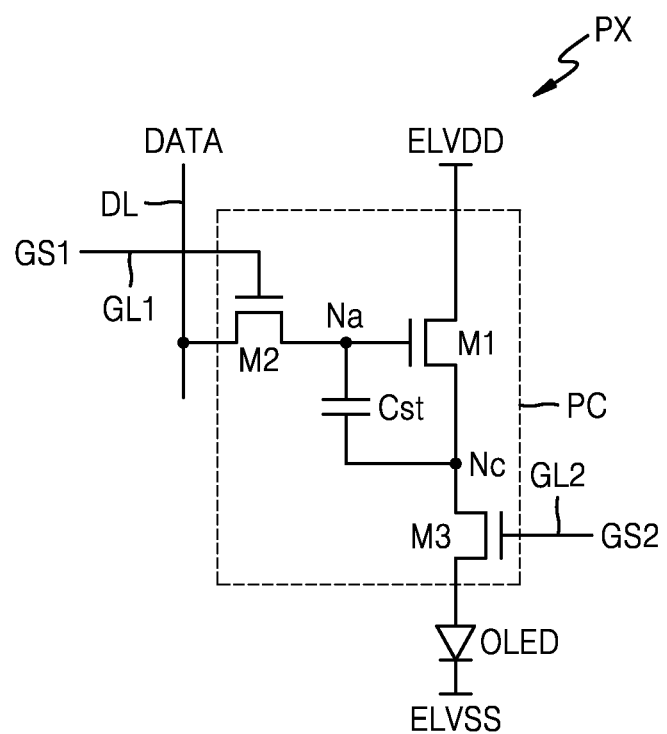

FIGS. 7A and 7B are equivalent circuit diagrams showing the pixel PX according to an embodiment.

Referring to FIG. 7A, the pixel PX may include a pixel circuit PC and an organic light-emitting diode OLED as a display element connected to the pixel circuit PC. The pixel circuit PC may include a first transistor M1, a second transistor M2, a third transistor M3, and a capacitor Cst. The first transistor M1 may be a driving transistor in which a source-drain current is determined according to a gate-source voltage, and the second transistor M2 and the third transistor M3 may be switching transistors which are turned on/turned off according to a gate voltage.

The first transistor M1 may include a gate connected to a first node Na, a first terminal connected to a second node Nb, and a second terminal connected to a third node Nc. The first terminal of the first transistor M1 may be connected to a driving voltage line configured to supply the first power voltage ELVDD via the third transistor M3, and the second terminal of the first transistor M1 may be connected to a first electrode, e.g., pixel electrode, anode, of the organic light-emitting diode OLED. The first transistor M1 may serve as a driving transistor and may receive a data signal DATA according to a switching operation of the second transistor M2 and control the amount of current of a driving current flowing to the organic light-emitting diode OLED.

The second transistor M2, e.g., a data writing transistor, may include a gate connected to a first gate line GL1, a first terminal connected to a data line DL, and a second terminal connected to the first node Na and the gate of the first transistor M1. The second transistor M2 may be turned on according to a first gate signal GS1 input through the first gate line GL1 to electrically connect the data line DL and the first node Na to each other and transmit the data signal DATA input through the data line DL to the first node Na.

The third transistor M3, e.g., an emission control transistor, may include a gate connected to a second gate line GL2, a first terminal connected to the driving voltage line, and a second terminal connected to the second node Nb and the first terminal of the first transistor M1. The third transistor M3 may be turned on according to a second gate signal GS2 transmitted through the second gate line GL2, and thus, a current may flow through the organic light-emitting diode OLED.

The capacitor Cst may be connected between the first node Na and the second terminal of the first transistor M1. The capacitor Cst may store a voltage corresponding to a difference between a voltage received from the second transistor M2 and a potential of the second terminal of the first transistor M1.

The organic light-emitting diode OLED may include a first electrode, e.g., pixel electrode, anode, connected to the second terminal of the first transistor M1 and a second electrode, e.g., opposite electrode, cathode, to which the second power voltage ELVSS, which is a common voltage, is applied. The organic light-emitting diode OLED may emit light having certain brightness according to a driving current supplied from the first transistor M1.

In an embodiment, the third transistor M3 may be connected between the first transistor M1 and the organic light-emitting diode OLED. For example, as in the pixel circuit PC shown in FIG. 7B, the third transistor M3 may include a gate connected to the second gate line GL2, a first terminal connected to the third node Nc, and a second terminal connected to the first electrode of the organic light-emitting diode OLED.

In FIGS. 7A and 7B, the first to third transistors M1 to M3 of the pixel circuit PC may be N-channel transistors. For example, the first to third transistors M1 to M3 may be oxide thin-film transistors.

The pixel circuit PC shown in FIGS. 7A and 7B is an example, and various pixel circuits PC including at least one transistor configured to receive at least one gate signal may be applied to one or more embodiments. For example, the pixel circuit PC of the pixel PX may include the first transistor M1, which is a driving transistor, the second transistor M2 configured to transmit a data signal, and the third transistor M3 configured to control light emission of the organic light-emitting diode OLED, and may further include at least one transistor for another function.

Figure 8:
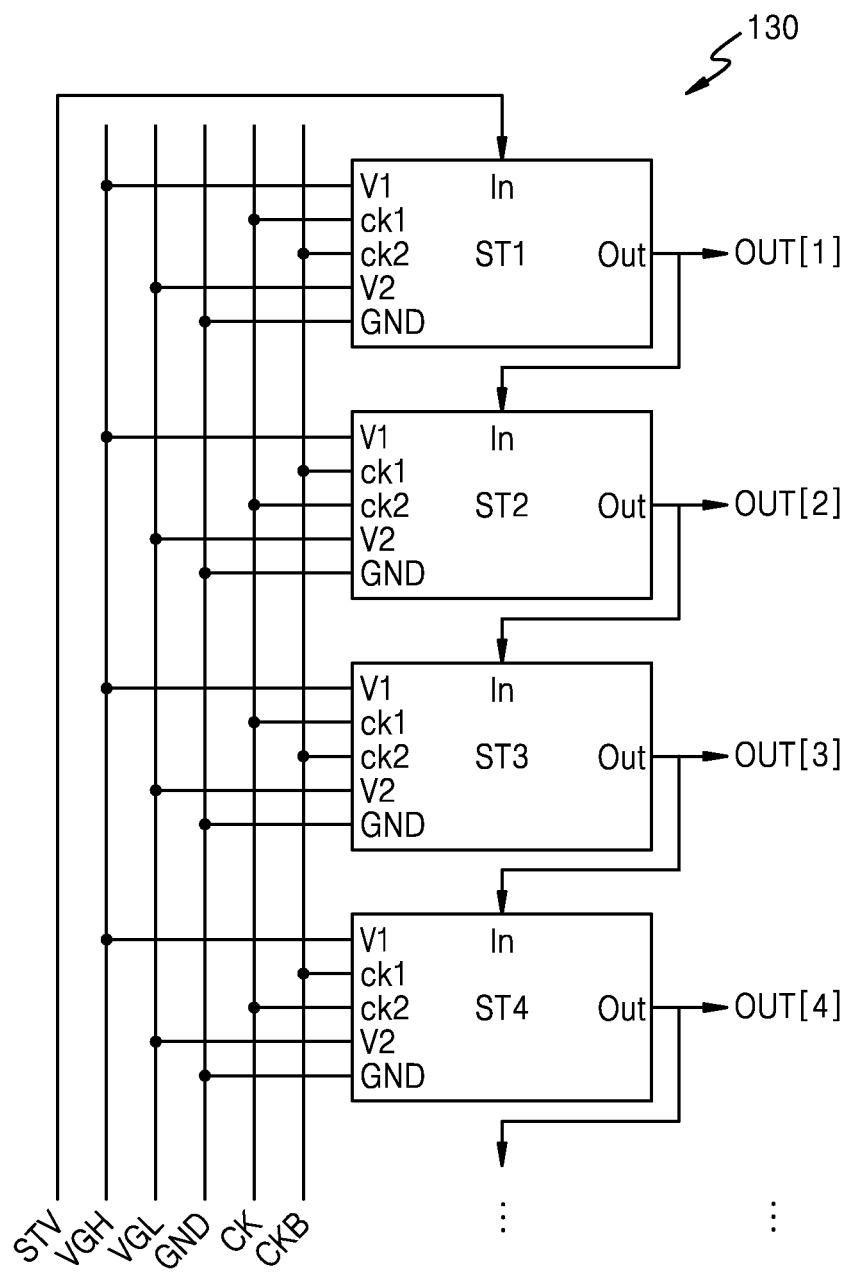
FIG. 8 is a schematic diagram of a gate driving circuit according to an embodiment.

FIG. 8 is a schematic diagram of the gate driving circuit 130 according to an embodiment.

Referring to FIG. 8, the gate driving circuit 130 may include a shift register (or a stage) for sequentially generating and outputting a gate signal. The gate driving circuit 130 may include a plurality of stages ST1, ST2, ST3, ST4, .... The plurality of stages ST1, ST2, ST3, ST4, ... may sequentially output output signals OUT[1], OUT[2], OUT[3], OUT[4], .... Each of the stages ST1, ST2, ST3, ST4, ... may correspond to a pixel row. e.g., a pixel line, provided in the pixel portion 110. The number of stages of the gate driving circuit 130 may be variously modified according to the number of pixel rows.

The stages ST1, ST2, ST3, ST4, ... may output the output signals OUT[1], OUT[2], OUT[3], OUT[4], ... in response to a start signal. An output signal output from each of the stages ST1, ST2, ST3, ST4, ... may be a gate signal for controlling turn-on and turn-off of a transistor. Each of the stages ST1, ST2, ST3, ST4, ... may be connected to a gate line of a corresponding pixel row. In an embodiment, an output signal output from each of the stages ST1, ST2, ST3, ST4, . . . may be a gate signal for controlling turn-on and turn-off of an N-channel transistor. For example, an output signal output from each of the stages ST1, ST2, ST3, ST4, . . . may be the second gate signal GS2 applied to the second gate line GL2 connected to the gate of the third transistor M3 of FIGS. 7A and 7B.

Each of the stages ST1, ST2, ST3, ST4, . . . may include the input terminal In, the first clock terminal ck1, the second clock terminal ck2, the first voltage input terminal V1, the second voltage input terminal V2, the ground terminal GND, and the output terminal Out.

The input terminal In may receive an external signal STV or a carry signal output from a previous stage as a start signal. In an embodiment, the external signal STV may be applied to the input terminal In of the first stage ST1, and starting from the second stage ST2, a carry signal, e.g., a previous carry signal, output from a previous stage may be applied to the input terminal In. The previous stage may be at least one previous stage, and the next stage may be at least one next stage. In an embodiment, the previous carry signal may be a carry signal output from an adjacent immediately preceding stage. In an embodiment, the carry signal may be an output signal output from a previous stage. For example, the first stage ST1 may start driving due to the external signal STV, and the output signal OUT[1] output from the first stage ST1 may be input to the input terminal In of the second stage ST2 as a carry signal.

The first clock signal CK or the second clock signal CKB may be applied to the first clock terminal ck1 and the second clock terminal ck2. The first clock signal CK and the second clock signal CKB may be alternately applied to the stages ST1, ST2, ST3, ST4, . . . . For example, the first clock signal CK may be applied to the first clock terminal ck1 of an odd-numbered stage, and the second clock signal CKB may be applied to the second clock terminal ck2 of the odd-numbered stage. In addition, the second clock signal CKB may be applied to the first clock terminal ck1 of an even-numbered stage, and the first clock signal CK may be applied to the second clock terminal ck2 of the even-numbered stage.

The first voltage VGH, which is a high-level voltage, may be applied to the first voltage input terminal V1, and the second voltage VGL, which is a low-level voltage, may be applied to the second voltage input terminal V2. The first voltage VGH and the second voltage VGL, which are global signals, may be supplied from the controller 170 shown in FIG. 6 and/or a power supply not shown.

The output terminal Out may output the output signal OUT, and the output signal OUT may be applied to a gate line connected to the output terminal Out as a gate signal. In addition, the output signal OUT may be applied to the input terminal In of the next stage as a carry signal.

Figure 9:
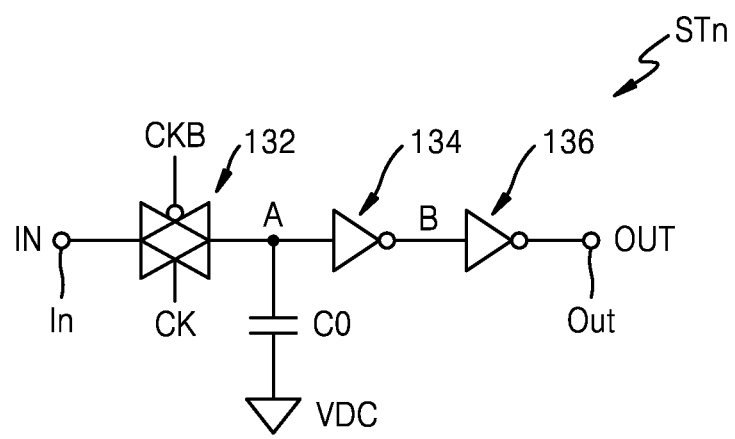
FIGS. 9 and 10 are diagrams showing a stage of a gate driving circuit according to an embodiment.
Figure 10:
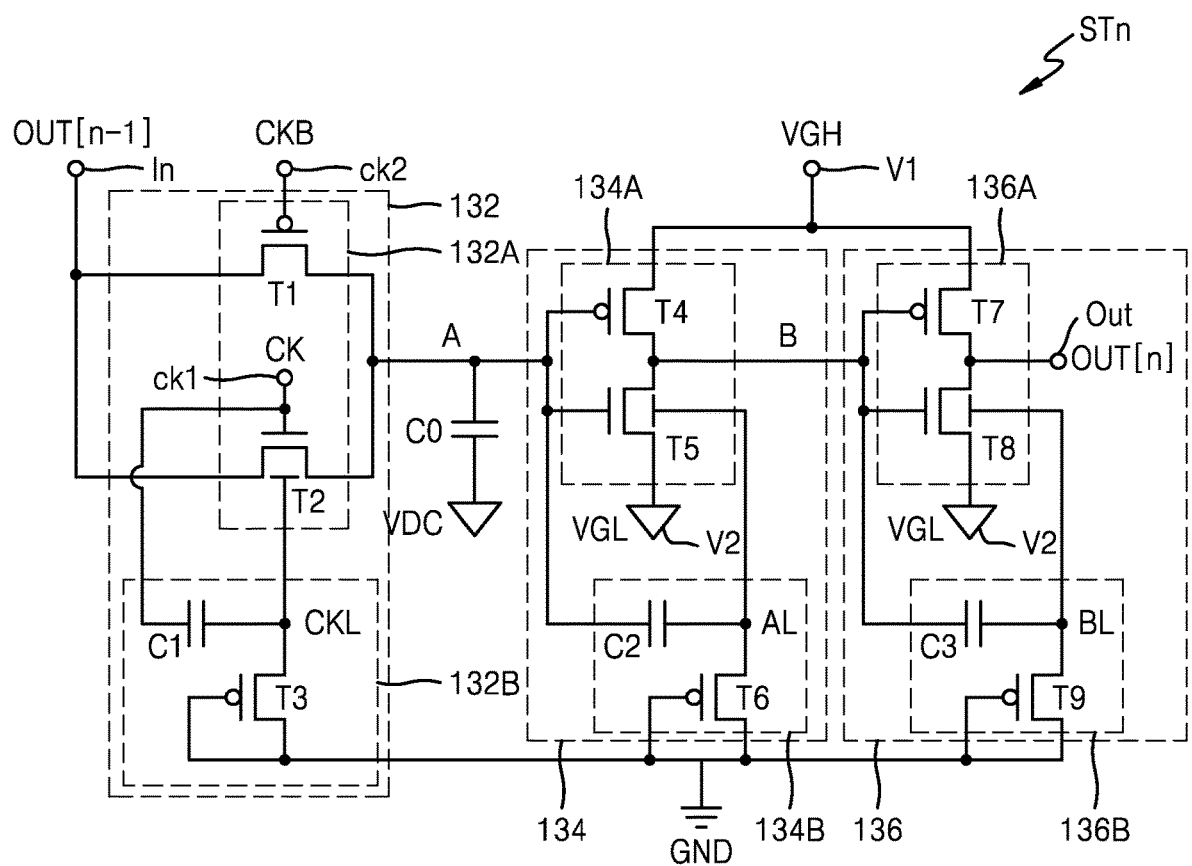
Figure 11:
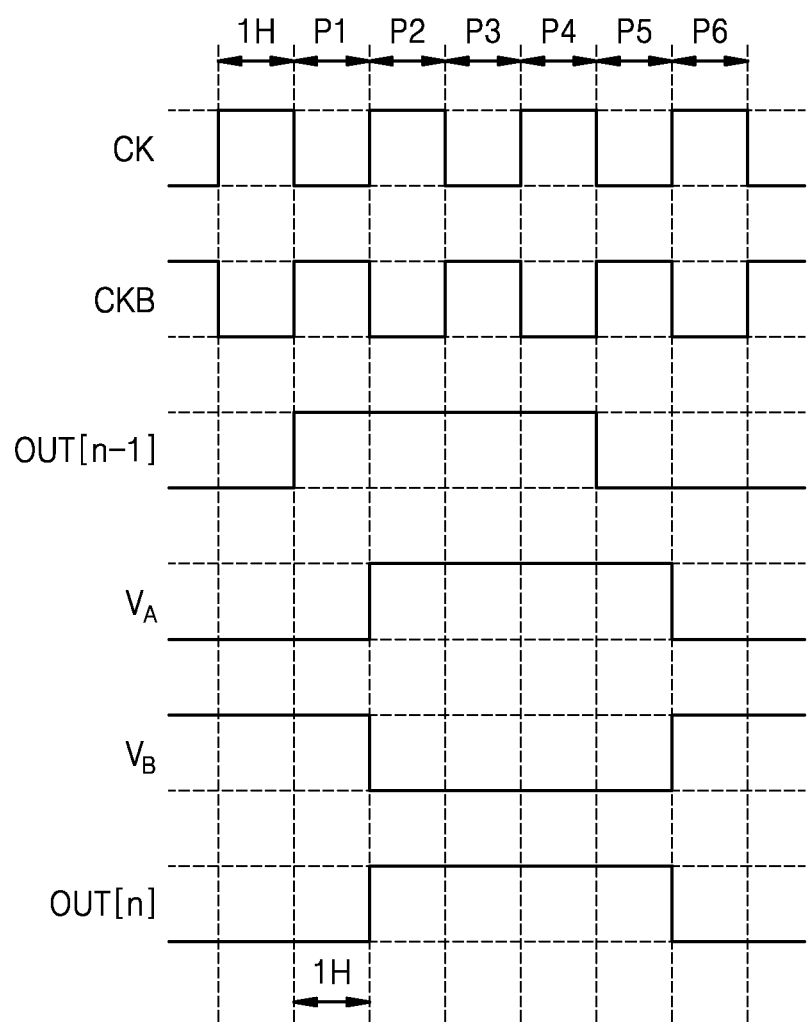
FIG. 11 is a waveform diagram for explaining driving of the stage of FIG. 10.

FIGS. 9 and 10 are diagrams showing a stage STn of a gate driving circuit according to an embodiment. FIG. 11 is a waveform diagram for explaining driving of the stage STn of FIG. 10. Hereinafter, an n-th stage connected to a gate line of an n-th pixel row will be illustrated as an odd-numbered stage. Hereinafter, for convenience of description, a high-level voltage will be referred to as a high voltage, and a low-level voltage will be referred to as a low voltage.

Referring to FIG. 9, a gate driving circuit according to an embodiment may include a plurality of stages, and each stage may include a signal transmission unit 132 and an inverter. The signal transmission unit 132 may be a circuit configured to receive the first clock signal CK, which is a clock signal, and the second clock signal CKB, which is an inverted clock signal, and transmit the input signal IN to a first node A. The inverter may be a circuit configured to receive a first voltage as a first reference voltage and a second voltage as a second reference voltage, invert a voltage level of a voltage of a first node A, and output a voltage of the inverted voltage level. The inverter may include a first inverter 134 and a second inverter 136. The first inverter 134 may invert a voltage level of a voltage of a first node A and output a voltage of the inverted voltage level to a second node B. The second inverter 136 may invert a voltage level of a voltage of the second node B and output a voltage of the inverted voltage level to the output terminal Out. Each stage may further include a fourth capacitor C0 connected between the first node A and a third voltage supply terminal. Each of the signal transmission unit 132, the first inverter 134, and the second inverter 136 may include a plurality of transistors. Some of the plurality of transistors may be P-channel transistors, and some may be N-channel transistors.

More specifically, referring to FIG. 10, the stage STn may include the signal transmission unit 132, the first inverter 134, and the second inverter 136. The stage STn may further include a fourth capacitor C0 connected between the first node A and a terminal to which a third voltage VDC is applied.

The signal transmission unit 132 may be connected between the input terminal In and the first node A and may transmit the input signal IN to the first node A according to the first clock signal CK and the second clock signal CKB. A signal of the first node A may be stored in the fourth capacitor C0. The signal transmission unit 132 may be implemented as the transmission gate circuit TG of FIG. 4.

The first inverter 134 may be connected between the first node A and a second node B and may invert a signal of the first node A and output the inverted signal to the second node B. Signal invert may mean an inversion of voltage level of a signal, and the inverted signal may mean a signal with an inverted voltage level. The second inverter 136 may be connected between the second node B and the output terminal Out and may invert a signal of the second node B and output the inverted signal to the output terminal Out. The first inverter 134 and the second inverter 136 may be implemented as the inverter circuit INV of FIG. 2.

Each of the signal transmission unit 132, the first inverter 134, and the second inverter 136 may include at least one transistor. The at least one transistor may include an N-channel transistor and/or a P-channel transistor. For example, as shown in FIG. 10, a first transistor T1, a third transistor T3, a fourth transistor T4, a sixth transistor T6, a seventh transistor T7, and a ninth transistor T9 of the stage STn may be P-channel transistors, and a second transistor T2, a fifth transistor T5, and an eighth transistor T8 of the stage STn may be N-channel transistors. The P-channel transistor may be P-channel silicon semiconductor transistors. The N-channel transistor may be a N-channel oxide semiconductor transistor. The N-channel oxide semiconductor transistor may be a dual gate transistor including a first gate, which is a top gate disposed above a semiconductor, and a second gate, which is a bottom gate disposed under the semiconductor.

The signal transmission unit 132 may include a switch unit 132A and a first node controller 132B. The signal transmission unit 132 may shift a start signal applied to the input terminal In by a certain time and transmit the shifted signal to the first node A.

The switch unit 132A may include the first transistor T1 and the second transistor T2.

The first transistor T1 and the second transistor T2 may be connected in parallel between the input terminal In and the first node A. The switch unit 132A may transmit the input signal IN applied to the input terminal In to the first node A according to the first clock signal CK and the second clock signal CKB.

The first transistor T1 may include a gate connected to the second clock terminal ck2, a first terminal connected to the input terminal In, and a second terminal connected to the first node A.

The second transistor T2 may include a first gate connected to the first clock terminal ck1 and a second gate connected to a first control node CKL. The second transistor T2 may include a first terminal connected to the input terminal In and a second terminal connected to the first node A.

The first node controller 132B may include a first capacitor C1 and the third transistor T3. The first node controller 132B may control a voltage of the first control node CKL, based on the first clock signal CK. A voltage applied to the second gate of the second transistor T2 may be controlled according to the voltage of the first control node CKL to control a threshold voltage of the second transistor T2.

The first capacitor C1 may include a first electrode connected to the first clock terminal ck1 and a second electrode connected to the first control node CKL.

The third transistor T3 may include a gate connected to the ground terminal GND, a first terminal connected to the first control node CKL, and a second terminal connected to the ground terminal GND. The third transistor T3 may be connected to the first control node CKL in a diode connection manner in which the gate and the second terminal are connected to the ground terminal GND. The third transistor T3 may be a control transistor configured to control a voltage of the first control node CKL together with the first capacitor C1.

The fourth capacitor C0 may include a first electrode connected to the first node A and a second electrode connected to a terminal to which the third voltage VDC is applied. In an embodiment, the third voltage VDC may be the first voltage VGH or the second voltage VGL. Alternatively, the terminal to which the third voltage VDC is applied may be the ground terminal GND. The fourth capacitor C0 may store a voltage of the first control node CKL.

The first inverter 134 may include a first output unit 134A and a second node controller 134B.

The first output unit 134A may include the fourth transistor T4 and the fifth transistor T5.

The fourth transistor T4 may include a gate connected to the first node A, a first terminal connected to the first voltage input terminal V1, and a second terminal connected to the second node B. The fourth transistor T4 may be a pull-up transistor configured to transfer the first voltage VGH to the second node B when turned on.

The fifth transistor T5 may include a first gate connected to the first node A and a second gate connected to a second control node AL. The fifth transistor T5 may include a first terminal connected to the second node B and a second terminal connected to the second voltage input terminal V2. The fifth transistor T5 may be a pull-down transistor configured to transfer the second voltage VGL to the second node B when turned on.

The second node controller 134B may include a second capacitor C2 and the sixth transistor T6. The second node controller 134B may control a voltage of the second control node AL, based on a voltage of the first node A. A voltage applied to the second gate of the fifth transistor T5 may be controlled according to the voltage of the second control node AL to control a threshold voltage of the fifth transistor T5. The sixth transistor T6 may be a control transistor configured to control a voltage of the second control node AL together with the second capacitor C2.

The second capacitor C2 may include a first electrode connected to the first node A and a second electrode connected to the second control node AL.

The sixth transistor T6 may include a gate connected to the ground terminal GND, a first terminal connected to the second control node AL, and a second terminal connected to the ground terminal GND. The sixth transistor T6 may be connected to the second control node AL in a diode connection manner in which the gate and the second terminal are connected to the ground terminal GND.

The second inverter 136 may include a second output unit 136A and a third node controller 136B.

The second output unit 136A may include the seventh transistor T7 and the eighth transistor T8. The second output unit 136A may be an output buffer, and the seventh transistor T7 and the eighth transistor T8 may be buffer transistors configured to output an output signal OUT[n].

The seventh transistor T7 may include a gate connected to the second node B, a first terminal connected to the first voltage input terminal V1, and a second terminal connected to the output terminal Out. The seventh transistor T7 may be a pull-up transistor configured to transfer the first voltage VGH to the output terminal Out when turned on.

The eighth transistor T8 may include a first gate connected to the second node B and a second gate connected to a third control node BL. The eighth transistor T8 may include a first terminal connected to the output terminal Out and a second terminal connected to the second voltage input terminal V2. The eighth transistor T8 may be a pull-down transistor configured to transfer the second voltage VGL to the output terminal Out when turned on.

The third node controller 136B may include a third capacitor C3 and the ninth transistor T9. The third node controller 136B may control a voltage of the third control node BL, based on a voltage of the second node B. A voltage applied to the second gate of the eighth transistor T8 may be controlled according to the voltage of the third control node BL to control a threshold voltage of the eighth transistor T8. The ninth transistor T9 may be a control transistor configured to control a voltage of the third control node BL together with the third capacitor C3.

The third capacitor C3 may include a first electrode connected to the second node B and a second electrode connected to the third control node BL.

The ninth transistor T9 may include a gate connected to the ground terminal GND, a first terminal connected to the third control node BL, and a second terminal connected to the ground terminal GND. The ninth transistor T9 may be connected to the third control node BL in a diode connection manner in which the gate and the second terminal are connected to the ground terminal GND.

Referring to FIG. 11, a width of each of first to sixth durations P1 to P6 may be one horizontal period 1H. In FIG. 11, the first clock signal CK, the second clock signal CKB, a previous output signal OUT[n−1], which is a previous carry signal, a voltage level VA of the first node A, a voltage level VB of the second node B, and the output signal OUT[n] are shown.

During the first duration P1, the previous output signal OUT[n−1] input from a previous stage to the input terminal In may be a high voltage, the first clock signal CK input to the first clock terminal ck1 may be a low voltage, and the second clock signal CKB input to the second clock terminal ck2 may be a high voltage.

As the first transistor T1 is turned off by the high-voltage second clock signal CKB, and the second transistor T2 is turned off by the low-voltage first clock signal CK, the first node A may maintain a low-level state due to a low voltage stored in the fourth capacitor C0 before the first duration P1. In this regard, a negative voltage having a lower level than the second voltage VGL may be applied to a second gate of the second transistor T2 connected to the first control node CKL, and thus, a threshold voltage of the second transistor T2 may increase, thereby stably turning off the second transistor T2.

The fourth transistor T4 having a gate connected to the low-level first node A may be turned on, and as the first voltage VGH is transferred to the second node B by the turned-on fourth transistor T4, the second node B may maintain a high-level state. The fifth transistor T5 having a first gate connected to the low-level first node A may be turned off, and as a negative voltage having a lower level than the second voltage VGL is applied to a second gate of the fifth transistor T5 connected to the second control node AL, a threshold voltage of the fifth transistor T5 may increase, thereby stably turning off the fifth transistor T5.

The seventh transistor T7 having a gate connected to the high-level second node B may be turned off, and the eighth transistor T8 having a first gate connected to the high-level second node B may be turned on. In this regard, a positive voltage having a higher level than the second voltage VGL may be applied to a second gate of the eighth transistor T8 connected to the third control node BL, and thus, a threshold voltage of the eighth transistor T8 may decrease, thereby stably turning on the eighth transistor T8. The second voltage VGL may be transferred to the output terminal Out by the turned-on eighth transistor T8 to output the low-voltage output signal OUT[n] from the output terminal Out.

During the second duration P2, the previous output signal OUT[n−1] may be a high voltage, the first clock signal CK may be a high voltage, and the second clock signal CKB may be a low voltage.

The first transistor T1 may be turned on by the low-voltage second clock signal CKB, and the second transistor T2 may be turned on by the high-voltage first clock signal CK. The high-voltage previous output signal OUT[n−1] may be transmitted to the first node A by the turned-on first and second transistors T1 and T2, and the first node A may be in a high-level state. In this regard, a positive voltage having a higher level than the second voltage VGL may be applied to a second gate of the second transistor T2 connected to the first control node CKL, and thus, a threshold voltage of the second transistor T2 may decrease, thereby stably turning on the second transistor T2. A high voltage of the first node A may be stored in the fourth capacitor C0.

The fourth transistor T4 having a gate connected to the high-level first node A may be turned off, and the fifth transistor T5 having a first gate connected to the high-level first node A may be turned on. In this regard, a positive voltage having a higher level than the second voltage VGL may be applied to a second gate of the fifth transistor T5 connected to the second control node AL, and thus, a threshold voltage of the fifth transistor T5 may decrease, thereby stably turning on the fifth transistor T5. The second voltage VGL may be transferred to the second node B by the turned-on fifth transistor T5, and thus, the second node B may be in a low-level state.

The seventh transistor T7 having a gate connected to the low-level second node B may be turned on, and the first voltage VGH may be transferred to the output terminal Out by the turned-on seventh transistor T7 to output the high-voltage output signal OUT[n] from the output terminal Out. The eighth transistor T8 having a first gate connected to the low-level second node B may be turned off, and as a negative voltage having a lower level than the second voltage VGL is applied to a second gate of the eighth transistor T8 connected to the third control node BL, a threshold voltage of the eighth transistor T8 may increase, thereby stably turning off the eighth transistor T8.

During the third duration P3, the previous output signal OUT[n−1] may be a high voltage, the first clock signal CK may be a low voltage, and the second clock signal CKB may be a high voltage.

As the first transistor T1 is turned off by the high-voltage second clock signal CKB, and the second transistor T2 is turned off by the low-voltage first clock signal CK, the first node A may maintain a high-level state due to the high voltage stored in the fourth capacitor C0 during the second duration P2.

The fourth transistor T4 having a gate connected to the high-level first node A may be turned off, and the fifth transistor T5 having a first gate connected to the high-level first node A may be turned on. The second voltage VGL may be transferred to the second node B by the turned-on fifth transistor T5, and thus, the second node B may maintain a low-level state.

The eighth transistor T8 having a first gate connected to the low-level second node B may be turned off. The seventh transistor T7 having a gate connected to the low-level second node B may be turned on, and the first voltage VGH may be transferred to the output terminal Out by the turned-on seventh transistor T7 to output the high-voltage output signal OUT[n] from the output terminal Out.

During the fourth duration P4, the previous output signal OUT[n−1] may be a high voltage, the first clock signal CK may be a high voltage, and the second clock signal CKB may be a low voltage.

The first transistor T1 may be turned on by the low-voltage second clock signal CKB, and the second transistor T2 may be turned on by the high-voltage first clock signal CK. The high-voltage previous output signal OUT[n−1] may be transmitted to the first node A by the turned-on first and second transistors T1 and T2, and the first node A may be in a high-level state. A high voltage of the first node A may be stored in the fourth capacitor C0.

The fourth transistor T4 having a gate connected to the high-level first node A may be turned off, and the fifth transistor T5 having a first gate connected to the high-level first node A may be turned on. The second voltage VGL may be transferred to the second node B by the turned-on fifth transistor T5, and thus, the second node B may be in a low-level state.

The eighth transistor T8 having a first gate connected to the low-level second node B may be turned off, and the seventh transistor T7 having a gate connected to the low-level second node B may be turned on. The first voltage VGH may be transferred to the output terminal Out by the turned-on seventh transistor T7 to output the high-voltage output signal OUT[n] from the output terminal Out.

During the fifth duration P5, the previous output signal OUT[n−1] may be a low voltage, the first clock signal CK may be a low voltage, and the second clock signal CKB may be a high voltage.

As the first transistor T1 is turned off by the high-voltage second clock signal CKB, and the second transistor T2 is turned off by the low-voltage first clock signal CK, the first node A may maintain a high-level state due to the high voltage stored in the fourth capacitor C0 during the fourth duration P4.

The fourth transistor T4 having a gate connected to the high-level first node A may be turned off, and the fifth transistor T5 having a first gate connected to the high-level first node A may be turned on. The second voltage VGL may be transferred to the second node B by the turned-on fifth transistor T5, and thus, the second node B may maintain a low-level state.

The eighth transistor T8 having a first gate connected to the low-level second node B may be turned off. The seventh transistor T7 having a gate connected to the low-level second node B may be turned on, and the first voltage VGH may be transferred to the output terminal Out by the turned-on seventh transistor T7 to output the high-voltage output signal OUT[n] from the output terminal Out.

During the sixth duration P6, the previous output signal OUT[n−1] may be a low voltage, the first clock signal CK may be a high voltage, and the second clock signal CKB may be a low voltage.

The first transistor T1 may be turned on by the low-voltage second clock signal CKB, and the second transistor T2 may be turned on by the high-voltage first clock signal CK. The low-voltage previous output signal OUT[n−1] may be transmitted to the first node A by the turned-on first and second transistors T1 and T2, and the first node A may be in a low-level state. A low voltage of the first node A may be stored in the fourth capacitor C0.

The fifth transistor T5 having a first gate connected to the low-level first node A may be turned off, and the fourth transistor T4 having a gate connected to the low-level first node A may be turned on. The first voltage VGH may be transferred to the second node B by the turned-on fourth transistor T4, and thus, the second node B may be in a high-level state.

The seventh transistor T7 having a gate connected to the high-level second node B may be turned off, and the eighth transistor T8 having a first gate connected to the high-level second node B may be turned on. The second voltage VGL may be transferred to the output terminal Out by the turned-on eighth transistor T8 to output the low-voltage output signal OUT[n] from the output terminal Out.

Due to the high-voltage previous output signal OUT[n−1] input in synchronization with a low-voltage timing of the first clock signal CK and a high-voltage timing of the second clock signal CKB, the stage STn may output the output signal OUT of a high voltage shifted by 1H with respect to the previous output signal OUT[n−1].

An even-numbered stage is different from the odd-numbered stage in that the second clock signal CKB is applied to the first clock terminal ck1 and the first clock signal CK is applied to the second clock terminal ck2, and the other circuit configurations and operations thereof are the same as the circuit configurations and operations of the odd-numbered stage described with reference to FIGS. 10 and 11.

Figure 12:
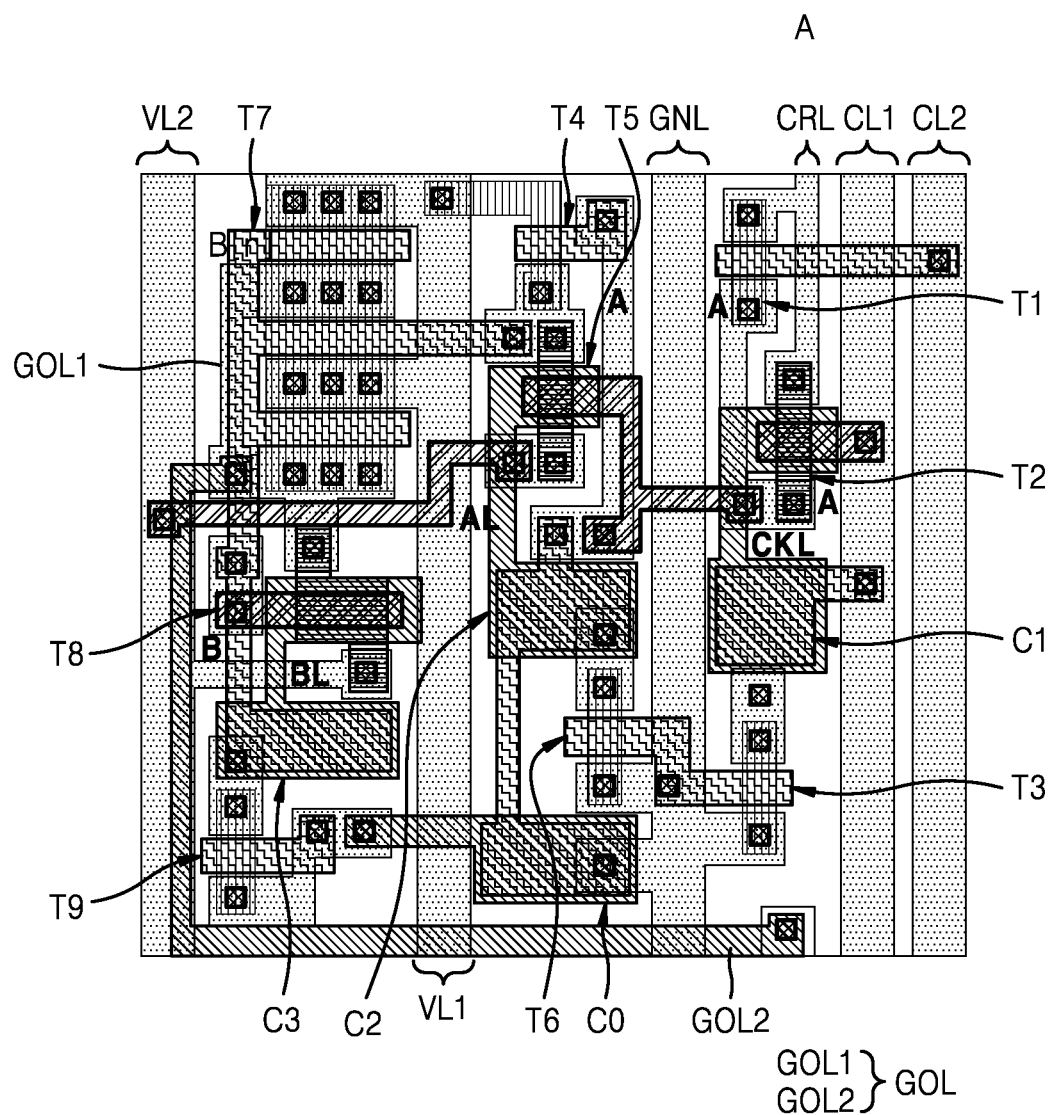
FIG. 12 is a diagram showing the stage of FIG. 10 according to an embodiment.
Figure 13:
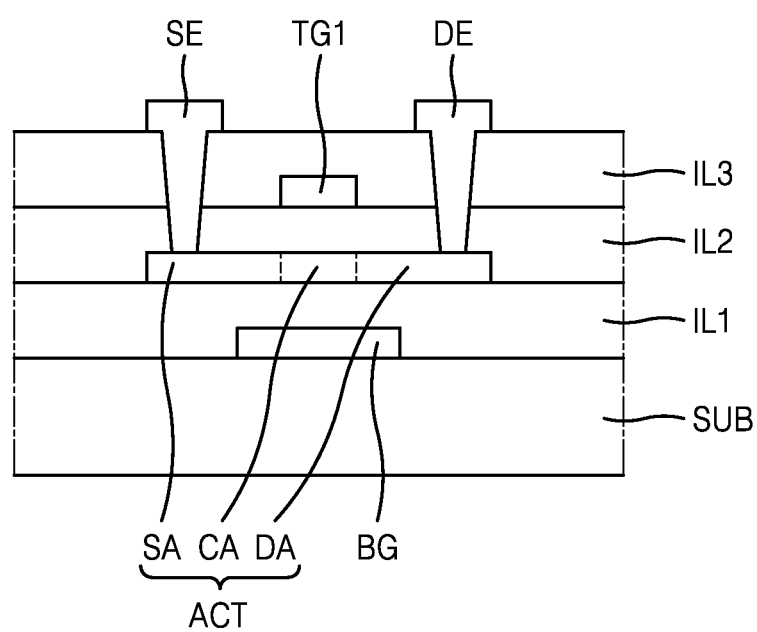
FIG. 13 is a schematic cross-sectional view of an N-channel transistor according to an embodiment.
Figure 14:
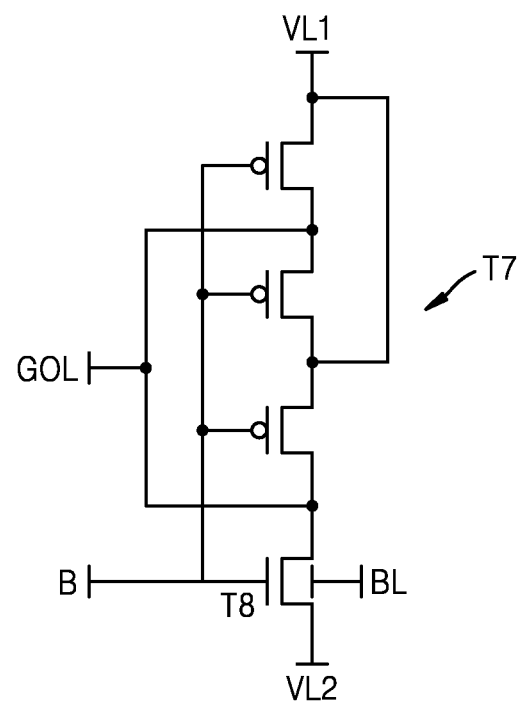
FIG. 14 is a circuit schematically showing a part of FIG. 12.

FIG. 12 is a diagram showing the stage STn of FIG. 10 according to an embodiment. FIG. 13 is a schematic cross-sectional view of an N-channel transistor according to an embodiment. FIG. 14 is a circuit schematically showing a part of FIG. 12.

Referring to FIG. 12, the first clock terminal ck1 may be connected to a first clock line CL1, and the second clock terminal ck2 may be connected to a second clock line CL2.

The first voltage input terminal V1 may be connected to a first voltage line VL1, and the second voltage input terminal V2 may be connected to a second voltage line VL2. The ground terminal GND may be connected to a ground line GNL. The input terminal In may be connected to a carry line CRL, and the carry line CRL may be connected to a previous gate line. The output terminal Out may be connected to an output line GOL, and the output line GOL may be connected to a gate line. The output line GOL may include output lines GOL1, GOL2.

As shown in FIG. 13, each of the second transistor T2, the fifth transistor T5, and the eighth transistor T8 may include a semiconductor layer ACT above a substrate SUB, a first gate TG1 above the semiconductor layer ACT and a second gate BG under the semiconductor layer ACT corresponding to a channel region CA of the semiconductor layer ACT. A source electrode SE is connected to a source region SA of the semiconductor layer ACT, and a drain electrode DE is connected to a drain region DA of the semiconductor layer ACT. A first insulating layer IL1 may be disposed between the second gate BG and the semiconductor layer ACT. A second insulating layer IL2 may be disposed between the semiconductor layer ACT and the first gate TG1. A third insulating layer IL3 may be disposed between the first gate TG1 and the source electrode SE/the drain electrode DE. The first insulating layer IL1, the second insulating layer IL2, and the third insulating layer IL3 may include an inorganic insulating material, such as silicon nitride ($SiN_x$), silicon oxynitride (SiON), and silicon oxide ($SiO_x$), and may have a single-layer or multi-layer structure including the above-described inorganic insulating material.

The second output unit 136A, which is an output buffer, may include the seventh transistor T7 and the eighth transistor T8. In an embodiment, as shown in FIGS. 12 and 14, the seventh transistor T7 may include three sub-transistors connected in parallel between the first voltage line VL1 and the output line GOL. Accordingly, a channel width of the seventh transistor T7 may be significantly obtained, and thus, signal output of the seventh transistor T7 may be improved. In an embodiment, the eighth transistor T8 may be implemented as an N-channel thin-film transistor having a dual gate structure, and output of the eighth transistor T8 may be improved by controlling a voltage of the second gate BG. Accordingly, there is no need to increase a channel width of the eighth transistor T8, and thus, a stage having the same performance and a reduced area compared to a stage in which the eighth transistor T8 is implemented as a P-channel thin-film transistor may be implemented.

According to embodiments described herein, an N-channel transistor may have a dual gate structure including a bottom gate and a top gate, and current characteristics of the transistor may be controlled by applying a bottom gate voltage and a top gate voltage differently from each other. In an embodiment, a bottom gate voltage of the N-channel transistor may be controlled by using a capacitor and a P-channel transistor having a diode connection structure, and thus, a threshold voltage of the N-channel transistor, e.g., a threshold voltage of the top gate, may be controlled. Accordingly, the N-channel transistor may be stably turned on and turned off, and thus, signal output using the N-channel transistor may be improved without increasing a size of the N-channel transistor.

According to one or more of the above-described embodiments, a gate driving circuit for stably outputting a gate signal and a display device including the same may be provided. The effect of the disclosure is not limited thereto and may be variously expanded without departing from the spirit of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A gate driving circuit comprising a plurality of stages, wherein each of the plurality of stages comprises:
    a signal transmission unit connected between an input terminal to which a start signal is configured to be applied and a first node, and configured to transmit, to the first node, the start signal according to a clock signal;
    a first inverter configured to control a voltage level of a second node according to a voltage level of the first node; and
    a second inverter configured to output an output signal of a first voltage of a first voltage level or a second voltage of a second voltage level according to the voltage level of the second node,
    wherein the second inverter comprises:
    a first pull-up transistor connected between a first voltage input terminal and an output terminal, and comprising a gate connected to the second node, the first voltage input terminal configured to supply the first voltage;
    a first pull-down transistor connected between a second voltage input terminal and the output terminal, and comprising a first gate connected to the second node and a second gate connected to a first control node, the second voltage input terminal configured to supply the second voltage;
    a first capacitor connected between the first gate of the first pull-down transistor and the first control node; and
    a first control transistor connected between the first control node and a ground terminal and comprising a gate connected to the ground terminal.

2. The gate driving circuit of claim 1, wherein the first pull-down transistor is an N-channel oxide transistor.

3. The gate driving circuit of claim 2, wherein the first gate of the first pull-down transistor is a top gate above a semiconductor layer, and the second gate of the first pull-down transistor is a bottom gate under the semiconductor layer.

4. The gate driving circuit of claim 1, wherein the first inverter comprises:
    a second pull-up transistor connected between the first voltage input terminal and the second node and comprising a gate connected to the first node;
    a second pull-down transistor connected between the second voltage input terminal and the second node and comprising a first gate connected to the first node and a second gate connected to a second control node;
    a second capacitor connected between the first gate of the second pull-down transistor and the second control node; and
    a second control transistor connected between the second control node and the ground terminal and comprising a gate connected to the ground terminal.

5. The gate driving circuit of claim 4, wherein the second pull-down transistor is an N-channel oxide transistor.

6. The gate driving circuit of claim 5, wherein the first gate of the second pull-down transistor is a top gate above a semiconductor layer, and the second gate of the second pull-down transistor is a bottom gate under the semiconductor layer.

7. The gate driving circuit of claim 1, wherein the signal transmission unit comprises:
    a first transistor connected between the input terminal and the first node and comprising a gate connected to a second clock terminal;
    a second transistor connected between the input terminal and the first node and comprising a first gate connected to a first clock terminal and a second gate connected to a third control node;
    a third capacitor connected between the first gate of the second transistor and the third control node; and
    a third control transistor connected between the third control node and the ground terminal and comprising a gate connected to the ground terminal.

8. The gate driving circuit of claim 7, wherein a second clock signal configured to be applied to the second clock terminal is an inverted signal of a first clock signal configured to be applied to the first clock terminal.

9. The gate driving circuit of claim 7, wherein the second transistor is an N-channel oxide transistor.

10. The gate driving circuit of claim 7, wherein the first gate of the second transistor is a top gate above a semiconductor layer, and the second gate of the second transistor is a bottom gate under the semiconductor layer.

11. The gate driving circuit of claim 1, further comprising a fourth capacitor connected between the first node and a third voltage supply terminal.

12. The gate driving circuit of claim 11, wherein the third voltage supply terminal is the ground terminal.

13. The gate driving circuit of claim 11, wherein the third voltage supply terminal is configured to receive the first voltage or the second voltage.

14. The gate driving circuit of claim 1, wherein the first pull-up transistor comprises a plurality of sub-transistors connected in parallel between the first voltage input terminal and the output terminal.

15. The gate driving circuit of claim 1, wherein the start signal is an output signal configured to be output from a previous stage.

16. A transmission gate circuit comprising:
    a first transistor connected between an input terminal and an output terminal and comprising a gate connected to a second clock terminal;
    a second transistor connected between the input terminal and the output terminal and comprising a first gate connected to a first clock terminal and a second gate connected to a control node;
    a capacitor connected between the first gate of the second transistor and the control node; and
    a third transistor connected between the control node and a ground terminal and comprising a gate connected to the ground terminal.

17. The transmission gate circuit of claim 16, wherein a second clock signal configured to be applied to the second clock terminal is an inverted signal of a first clock signal configured to be applied to the first clock terminal.

18. The transmission gate circuit of claim 16, wherein the second transistor is an N-channel oxide transistor.

19. An inverter circuit comprising:
a first transistor connected between a first voltage input terminal to which a first voltage of a first voltage level is configured to be applied and an output terminal, and comprising a gate connected to an input terminal;
a second transistor connected between a second voltage input terminal to which a second voltage of a second voltage level is configured to be applied and the output terminal, and comprising a first gate connected to the input terminal and a second gate connected to a control node;
a capacitor connected between the first gate of the second transistor and the control node; and
a third transistor connected between the control node and a ground terminal and comprising a gate connected to the ground terminal.

20. The inverter circuit of claim 19, wherein the second transistor is an N-channel oxide transistor.

21. A gate driving circuit comprising:
a transmission circuit configured to receive a clock signal and an inverted clock signal and transmit an input signal to a first node; and
an inverter circuit configured to receive a first reference voltage and a second reference voltage and invert and output a voltage level of a voltage of the first node,
wherein each of the transmission circuit and the inverter circuit comprises a P-channel transistor and an N-channel transistor,
wherein the transmission circuit comprises:
a first transistor connected between an input terminal and the first node, and comprising a gate connected to a second clock terminal to which the inverted clock signal is configured to be supplied;
a second transistor connected between the input terminal and the first node, and comprising a first gate connected to a first clock terminal to which the clock signal is configured to be supplied and a second gate connected to a first control node;
a first capacitor connected between the first gate of the second transistor and the first control node; and
a first control transistor connected between the first control node and a ground terminal and comprising a gate connected to the ground terminal,
wherein the second transistor is an N-channel transistor.

22. The gate driving circuit of claim 21, wherein the inverter circuit comprises:
a first inverter configured to invert a voltage level of a voltage of the first node and output a voltage of the inverted voltage level to a second node; and
a second inverter configured to invert a voltage level of a voltage of the second node and output a voltage of the inverted voltage level to an output terminal.

23. The gate driving circuit of claim 21, further comprising a fourth capacitor connected between the first node and a third voltage supply terminal.

24. A gate driving circuit comprising:
a transmission circuit configured to receive a clock signal and an inverted clock signal and transmit an input signal to a first node; and
an inverter circuit configured to receive a first reference voltage and a second reference voltage and invert and output a voltage level of a voltage of the first node,
wherein each of the transmission circuit and the inverter circuit comprises a P-channel transistor and an N-channel transistor,
wherein the inverter circuit comprises:
a first inverter configured to invert a voltage level of a voltage of the first node and output a voltage of the inverted voltage level to a second node; and
a second inverter configured to invert a voltage level of a voltage of the second node and output a voltage of the inverted voltage level to an output terminal, wherein the first inverter comprises:
a fourth transistor connected between a first voltage input terminal configured to supply the first reference voltage and the second node, and comprising a gate connected to the first node;
a fifth transistor connected between a second voltage input terminal configured to supply the second reference voltage and the second node, and comprising a first gate connected to the first node and a second gate connected to a second control node;
a second capacitor connected between the first gate of the fifth transistor and the second control node; and
a sixth transistor connected between the second control node and a ground terminal and comprising a gate connected to the ground terminal,
wherein the fifth transistor is an N-channel transistor.

25. A gate driving circuit comprising:
a transmission circuit configured to receive a clock signal and an inverted clock signal and transmit an input signal to a first node; and
an inverter circuit configured to receive a first reference voltage and a second reference voltage and invert and output a voltage level of a voltage of the first node,
wherein each of the transmission circuit and the inverter circuit comprises a P-channel transistor and an N-channel transistor,
wherein the inverter circuit comprises:
a first inverter configured to invert a voltage level of a voltage of the first node and output a voltage of the inverted voltage level to a second node; and
a second inverter configured to invert a voltage level of a voltage of the second node and output a voltage of the inverted voltage level to an output terminal, wherein the second inverter comprises:
a seventh transistor connected between a first voltage input terminal configured to supply the first reference voltage and the output terminal, and comprising a gate connected to the second node;
an eighth transistor connected between a second voltage input terminal configured to supply the second reference voltage and the output terminal, and comprising a first gate connected to the second node and a second gate connected to a third control node;
a third capacitor connected between the first gate of the eighth transistor and the third control node; and
a ninth transistor connected between the third control node and a ground terminal and comprising a gate connected to the ground terminal,
wherein the eighth transistor is an N-channel transistor.

\* \* \* \* \*